United States Patent
Kunz, Jr. et al.

(10) Patent No.: US 10,026,712 B2
(45) Date of Patent: Jul. 17, 2018

(54) ESD PROTECTION CIRCUIT WITH STACKED ESD CELLS HAVING PARALLEL ACTIVE SHUNT

(71) Applicant: Texas Instruments Incorporated, Dallas, TX (US)

(72) Inventors: John Eric Kunz, Jr., Allen, TX (US); Farzan Farbiz, Dallas, TX (US); Aravind C. Appaswamy, Dallas, TX (US); Akram A. Salman, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 17 days.

(21) Appl. No.: 14/558,392

(22) Filed: Dec. 2, 2014

(65) Prior Publication Data
US 2016/0156176 A1  Jun. 2, 2016

(51) Int. Cl.
| H02H 9/04 | (2006.01) |
| H01L 25/00 | (2006.01) |
| H01L 27/02 | (2006.01) |

(52) U.S. Cl.
CPC .......... *H01L 25/00* (2013.01); *H01L 27/0248* (2013.01); *H01L 27/0285* (2013.01); *H02H 9/046* (2013.01); *H01L 2924/0002* (2013.01)

(58) Field of Classification Search
CPC ....................................................... H02H 9/04
USPC ........................................................... 361/56
See application file for complete search history.

(56) References Cited

U.S. PATENT DOCUMENTS

| 5,946,177 | A | 8/1999 | Miller et al. | |
| 5,959,820 | A * | 9/1999 | Ker | H01L 27/0248 361/111 |
| 6,016,002 | A * | 1/2000 | Chen | H01L 27/0262 257/173 |
| 7,012,307 | B2 * | 3/2006 | Lin | H01L 27/0251 257/355 |
| 7,773,356 | B2 * | 8/2010 | Ryu | H01L 27/0262 361/111 |
| 7,911,748 | B1 * | 3/2011 | Chu | H01L 27/0266 361/11 |
| 2003/0076636 | A1 * | 4/2003 | Ker | H01L 27/0262 361/56 |
| 2013/0122677 | A1 * | 5/2013 | Esmark | H01L 23/60 438/361 |
| 2013/0161687 | A1 * | 6/2013 | Abou-Khalil | H01L 29/747 257/121 |

(Continued)

OTHER PUBLICATIONS

Petr Betak, et al., "Snap-back characteristics tuning of SCR-based semiconductor structures", WSEAS Transactions on Electronics, Issue 9, vol. 4, Sep. 2007, pp. 175-180.

*Primary Examiner* — Scott Bauer
(74) *Attorney, Agent, or Firm* — Jacqueline J. Garner; Charles A. Brill; Frank D. Cimino

(57) ABSTRACT

An electrostatic discharge (ESD) protection circuit includes a substrate having a semiconductor surface that the ESD protection circuit formed thereon. A first ESD cell is stacked in series with at least a second ESD cell. An active shunt transistor is electrically in parallel with the first ESD cell or second ESD cell, where the active shunt includes a control node. A trigger circuit has a trigger input and a trigger output, wherein the trigger output is coupled to the control node.

15 Claims, 4 Drawing Sheets

(56) References Cited

U.S. PATENT DOCUMENTS

2013/0163128 A1* 6/2013 Van Wijmeersch ........ H01L 27/0262
  361/56
2013/0270605 A1* 10/2013 Salcedo ............. H01L 27/0262
  257/120

* cited by examiner

… (1)

ESD PROTECTION CIRCUIT WITH STACKED ESD CELLS HAVING PARALLEL ACTIVE SHUNT

CROSS-REFERENCE TO RELATED APPLICATIONS

This application has subject matter related to copending application Ser. No. 14/221,445 entitled "PROGRAMMABLE ESD PROTECTION CIRCUIT" that was filed Mar. 21, 2014.

FIELD

Disclosed embodiments relate to electrostatic discharge (ESD) protection circuitry having series stacked ESD cells.

BACKGROUND

Modern high-density integrated circuits (ICs) are known to be vulnerable to damage from ESD from a charged body (human or otherwise) as the charged body physically contacts the IC. ESD damage occurs when the amount of charge exceeds the capability of the electrical conduction path through the IC. The typical ESD failure mechanisms include thermal runaway resulting in junction shorting, and dielectric breakdown resulting in gate-junction shorting in the metal-oxide-semiconductor (MOS) context.

An IC may be subjected to a damaging ESD event in the manufacturing process, during assembly, testing, or in the system application. In conventional IC ESD protection schemes, active clamp circuits are generally used to shunt ESD current between the power supply rails and thereby protect internal IC element nodes that are connected to bond pads from ESD damage.

One type of active ESD clamp circuit, known as an active Metal Oxide Semiconductor Field Effect Transistor (MOSFET) cell (active FET ESD cell), typically includes a trigger circuit coupled between the power supply rails that has a trigger output that couples to a gate of a large area MOSFET clamp transistor which acts as a shunting circuit being in parallel to the pin(s) being protected when triggered ON. The conduction of the clamp transistor(s) is controlled by the trigger circuit.

One known active FET based active ESD cell arrangement is based on a large area high-voltage MOS device (e.g. drain extended MOS (DEMOS), or laterally diffused MOS (LDMOS)). This arrangement has the negative attribute of consuming a large area because the entire ESD current (typically about 1.5 A) must be carried in the normal MOS mode (typically few hundred $\mu A/\mu m$ width). Such an active FET may comprise a PMOS, NMOS, or a bipolar junction transistor (BJT) using a different trigger circuit.

Another known active FET based active ESD cell arrangement is obtained by stacking two or more lower voltage ESD cells in series between the power supply rails. This arrangement increases the trigger voltage rating of the ESD protection circuit, such as by a factor of 2 for two series stacked ESD cells. This arrangement has the advantage of consuming less area, but suffers because the series combination increases all voltages by the same ratio. Thus, the headroom (i.e. the difference between the trigger-voltage and the normal operating voltage) is increased beyond what would be necessary for a single ESD cell design. Series ESD cells in this arrangement require that each ESD cell reach the voltage at which trigger current flows before any one ESD cell can trigger.

SUMMARY

This Summary is provided to introduce a brief selection of disclosed concepts in a simplified form that are further described below in the Detailed Description including the drawings provided. This Summary is not intended to limit the claimed subject matter's scope.

Disclosed embodiments include electrostatic discharge (ESD) protection circuits that include two or more ESD cells stacked in series enabling the ESD circuit to reach the desired holding voltage, along with an active shunt placed in parallel to allow bypassing one or more of the stacked ESD cells. Here and in this Disclosure, the term "cell" may generally be a single device, component, or circuit. The active shunt generally comprises an active shunt transistor comprising a Metal Oxide Semiconductor Field Effect Transistor (MOSFET) or a bipolar transistor, and a trigger circuit is coupled to drive a control node (e.g., a MOSFET gate or a base of the bipolar) of the active shunt transistor.

One advantage of disclosed ESD protection circuits is that the active shunt transistor can be a relatively small area transistor. For example, for a MOS-based active FET shunt transistor the transistor size only needs to be sufficient to carry the trigger current of the non-bypassed ESD cell, typically a few mAs of current, in order to allow the non-bypassed ESD cell(s) to trigger, without the bypassed ESD cell reaching a larger voltage (i.e. its trigger voltage). Thus the active shunt transistor used to bypass an ESD cell can be about 100× smaller in area as compared to the known active FET based active ESD cell arrangement based on a large area high-voltage MOS device described in the background above.

Disclosed ESD protection circuits are intended for use at input, output, input-output, or power supply terminals of an integrated circuit (IC), where a disclosed ESD protection circuit is generally coupled between a plurality of internal terminals of the IC and a power supply terminal VDD or VSS terminal. Such ESD protection circuits have been found to allow improved ESD performance, while maintaining latchup immunity as compared to SCR-based ESD cells, without the area and cost of an active FET arrangement.

BRIEF DESCRIPTION OF THE DRAWINGS

Reference will now be made to the accompanying drawings, which are not necessarily drawn to scale, wherein.

DETAILED DESCRIPTION

Figure 1A:
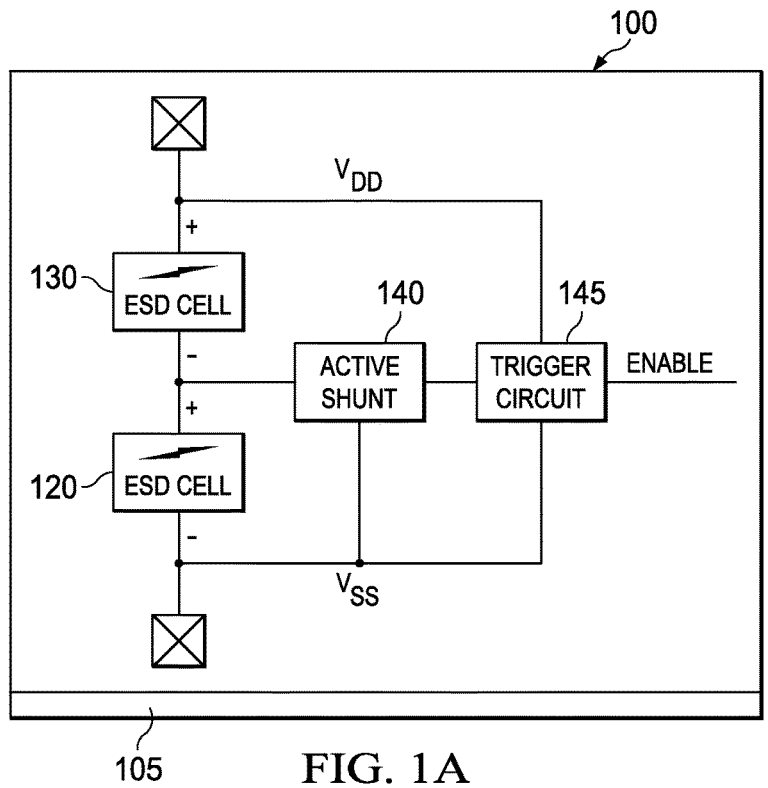
FIG. 1A is a schematic block diagram of an ESD protection circuit formed on a semiconductor surface of a substrate including two ESD cells stacked in series having an active shunt transistor in parallel with one of the stacked ESD cells, according to an example embodiment.

Example embodiments are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this disclosure.

Also, the terms "coupled to" or "couples with" (and the like) as used herein without further qualification are intended to describe either an indirect or direct electrical connection. Thus, if a first device "couples" to a second device, that connection can be through a direct electrical connection where there are only parasitics in the pathway, or through an indirect electrical connection via intervening items including other devices and connections. For indirect coupling, the intervening item generally does not modify the information of a signal but may adjust its current level, voltage level, and/or power level.

FIG. 1A is a schematic block diagram of an ESD protection circuit 100 formed on a substrate 105 including a first bypassed ESD cell (first ESD cell) 120 and a second non-bypassed ESD cell (second ESD cell) 130 stacked in series between a VDD rail and a VSS rail having an active shunt transistor (shown as an active shunt) 140 in parallel with one of the stacked ESD cells shown as the first ESD cell 120, according to an example embodiment. Although two ESD cells are generally shown herein stacked in series, disclosed embodiments can include three or more ESD cells, such as to obtain a desired higher trigger/holding voltage, where a single active shunt transistor may optionally bypass more than one ESD cell in the stack (e.g., see FIG. 1C described below). Bond pads are shown coupled to each of the VDD rail and the VSS rail. ESD protection circuitry 100 also includes a trigger circuit 145 that is coupled to drive a control node of the active shunt transistor 140. The enable input of the trigger circuit 145 shown in FIG. 1A as known in the art is generally used to disable the trigger circuit 145 under operating conditions where ESD is no longer a risk.

The first ESD cell 120 and second ESD cell 130 are generally snap-back type I-V characteristic ESD cells. For example, the snap-back cells can comprise a variety of arrangements such as semiconductor (e.g., silicon) controlled rectifier (SCR), junction field effect transistor (JFET), a gate grounded NMOS or PMOS transistor, or a zener diode.

In a typical embodiment the active shunt transistor 140 comprises at least one MOSFET such as a NMOS transistor that functions as an ESD shunting circuit with a desired low ON-resistance for protecting at least one terminal on an IC, such as nodes coupled to the VDD pad or an input/output node of functional circuitry. The active shunt transistor 140 may also comprise a PMOS transistor, or a BJT. As noted above, one advantage of disclosed ESD protection circuits, such as ESD protection circuit 100, is that the active shunt transistor can be a relatively small area transistor.

For example, for a MOS-based active FET shunt transistor the transistor size only needs to be sufficient to carry the trigger current of the second ESD cell 130 being a non-bypassed cell, typically a few mAs of current, in order to allow the second ESD cell 130 to trigger, without the first ESD cell 120 being a bypassed cell to reach a larger voltage (i.e. its trigger voltage). Thus the active shunt transistor used to bypass the an ESD cell can be about 100× smaller in area as compared to the known active FET based active ESD cell arrangement based on a large area high-voltage MOS device described in the Background above.

The trigger circuit 145 can comprise a variety of known arrangements. One arrangement is an RC network. The substrate 105 and/or its semiconductor surface can comprise silicon, silicon-germanium, or other semiconductor material. One particular arrangement is p– epi on a p+ substrate. Another particular arrangement is a silicon/germanium (SiGe) semiconductor surface on a silicon substrate.

It can be seen the trigger circuit 145 being between VDD and VSS has access to a larger voltage swing as compared to the active shunt transistor 140. This arrangement provides extra drive capability for the trigger circuit 145. For example, a disclosed MOS-based active shunt can be driven all the way to linear mode so that a lower drain to source voltage is provided as compared to that possible with a traditional active shunting ESD circuit.

Disclosed ESD protection circuits recognize there are advantages of using an active shunt transistor 140 over a passive shunt. One advantage is disclosed active shunt transistor 140 can be designed with large dynamic impedance, which can be modulated based on a variety of parameters using a variety of impedance modulation techniques, including based on the logical state (e.g. product powered up).

Figure 1B:
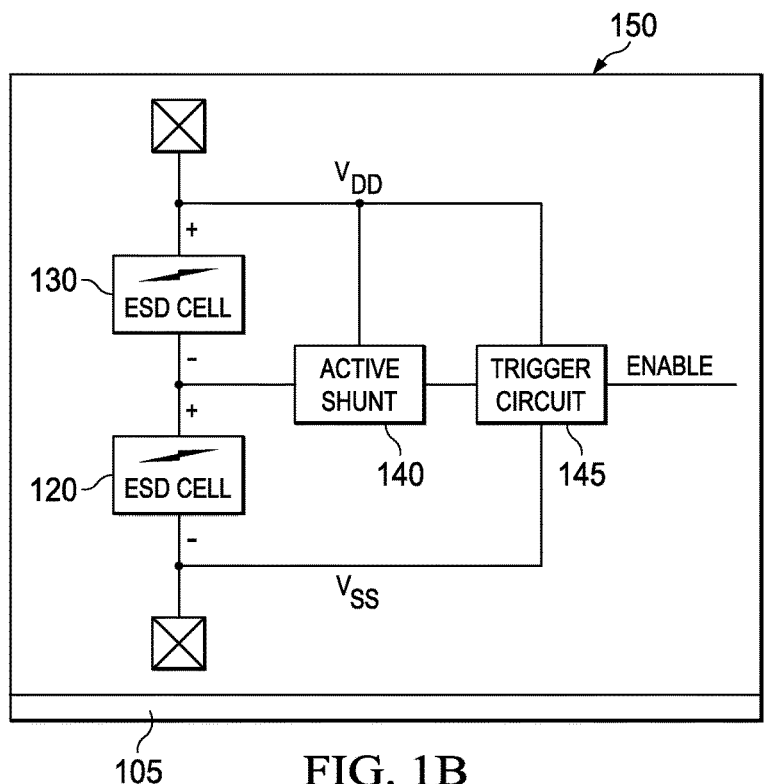
FIG. 1B is a schematic block diagram of an ESD protection circuit formed on a substrate including two ESD cells stacked in series having an active shunt transistor in parallel with another of the stacked ESD cells, according to example embodiment.

FIG. 1B is a schematic block diagram of an ESD protection circuit 150 formed on a substrate 105 including a first ESD cell 120 and a second ESD cell 130 stacked in series between a VDD rail and a VSS rail having an active shunt transistor 140 in parallel with one of the stacked ESD cells shown as the second ESD cell 130, according to another example embodiment. An advantage of ESD protection circuit 150 over ESD protection circuit 100 will generally depend on the relative trigger voltage of the second ESD cell 130 to the first ESD cell 120 and the type/style of the active shunt transistor 140, which could be based on voltage ratings of available components in the technology utilized.

Figure 1C:
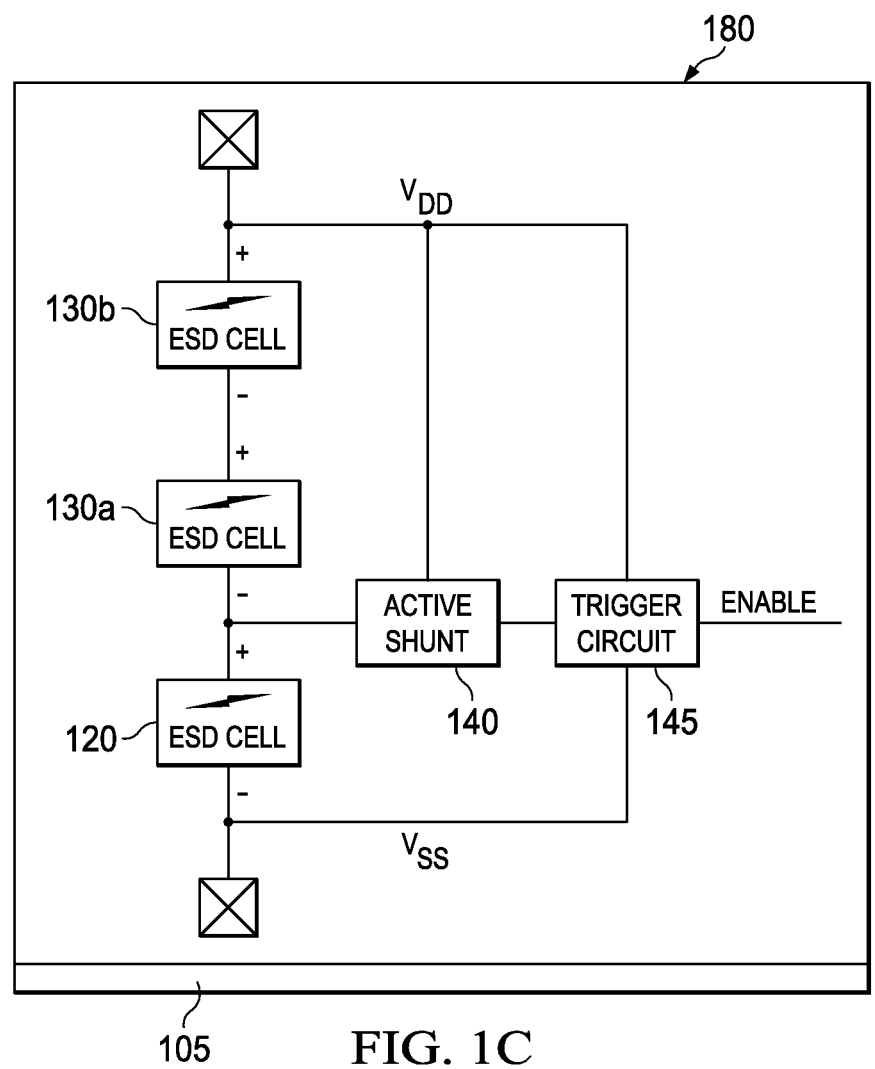
FIG. 1C is a schematic block diagram of an ESD protection circuit formed on a substrate including three ESD cells stacked in series having an active shunt transistor in parallel with two of the stacked ESD cells, according to example embodiment.

FIG. 1C is a schematic block diagram of an ESD protection circuit 180 formed on a substrate 105 including three ESD cells stacked in series having an active shunt transistor 140 in parallel with two of the stacked ESD cells shown as 130a and 130b, according to example embodiment. In this embodiment active shunt transistor 140 bypasses two ESD cell in the stack, with the first ESD cell 120 being non-bypassed. ESD protection circuit 180 can provide a desired higher trigger/holding voltage as compared to ESD protection circuit 100 or ESD protection circuit 150.

Figure 1D:
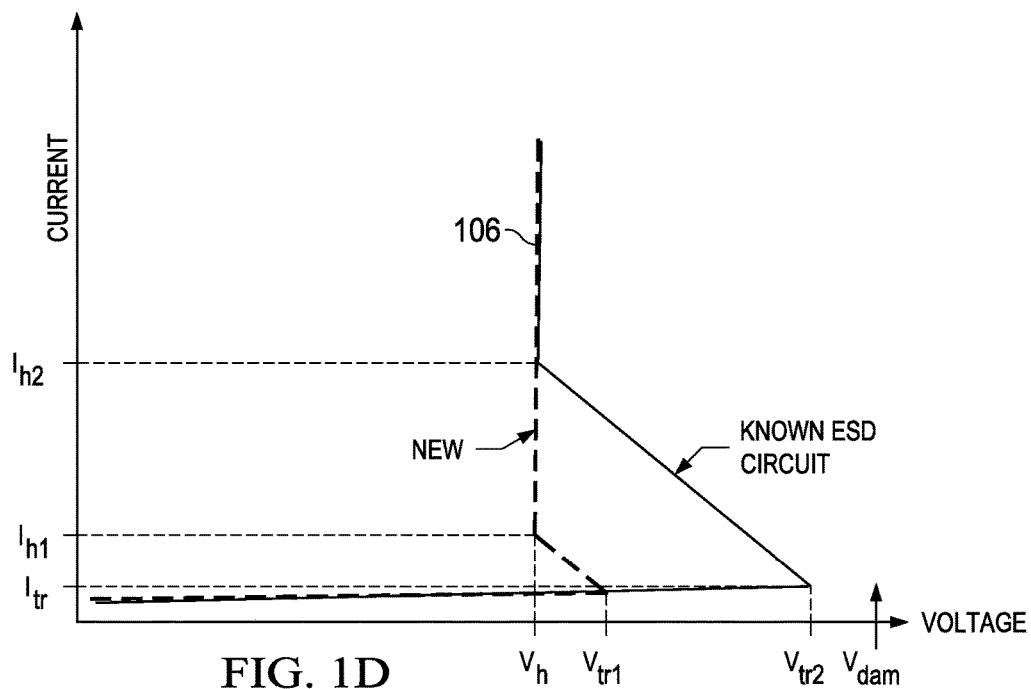
FIG. 1D depicts example current-voltage (IV) curves responsive to an applied transmission line pulse (TLP) for disclosed ESD protection circuit and a known ESD protection circuit having the same trigger circuit and series stacked ESD cells as the ESD protection circuit.

Operation of disclosed ESD protection circuits is illustrated in FIG. 1D which shows example current-voltage (IV) curves for disclosed ESD protection circuit 100 identified as "New" and a known ESD protection circuit having the same trigger circuit and series stacked ESD cells as ESD protection circuit 100 responsive to an ESD TLP. The functional circuit being protected operates at power supply voltage Vdd and for the terminal (or node) shown has a damage threshold shown as Vdam. When a positive ESD TLP is applied to the terminal of the functional circuit with respect to Vss, voltage at the terminal increases to trigger voltage Vtr and ESD cell conducts trigger current Itr. The ESD protection circuit then switches to a low impedance state and conducts holding current Ih at holding voltage Vh in the case of a snap back type ESD cell, such as comprising an SCR. Alternatively, Vh may be referred to as a snapback voltage for a bipolar NPN transistor.

The holding current shown as Ih1 for disclosed ESD protection circuit 100 as compared to Ih2 for known ESD protection circuit having series stacked ESD cells can be seen to be considerably less for disclosed ESD protection circuit 100. Current then increases along curve 106 to conduct the ESD current to power supply terminal Vss, thereby protecting the terminal of the functional circuit. The slope of curve 106 represents the resistance from the ESD source to the Vss terminal and includes the ON resistance of ESD cell as well as parasitic resistance of the discharge path.

In view of the foregoing explanation, it is generally important that Vtr is always less than Vdam so that the functional circuit is not damaged by the ESD pulse. It is also important that Vh is greater than Vdd, so that application of an ESD pulse while Vdd is applied to the circuit will not result in failure of ESD protection circuit or the functional circuit due to electrical overstress (EOS) from the Vdd power supply. Finally, it is important that the total resistance from the terminal to Vss be as small as practical to minimize power dissipation and heat generation during the ESD event.

It can be seen that the active shunt transistor in parallel with one or more of the stacked ESD cells for ESD protection circuit 100 lowers the trigger voltage from Vtr2 for the known ESD protection circuit to Vtr1, while the slope of curve 106 representing the resistance from the ESD source to the Vss terminal including the ON resistance of ESD circuit remains unchanged as does the holding voltage Vh. The significantly lower trigger voltage provided by ESD protection circuit 100 ensures that Vtr is always less than Vdam so that the functional circuit will not be damaged. Other advantages provided include the ability to disable lower trigger voltage state with enable/disable logic. Moreover, the trigger voltage for ESD protection circuit 100 can be modulated (or programmed) by changing the circuit design of the active shunt transistor 140, such as described below relative to FIG. 4 where the ratio of the capacitance from gate-source and gate-drain of an active shunt transistor 140 comprising NMOS transistor (MN0) changes (is a function of) with the gate voltage applied to MN0.

Figure 2:
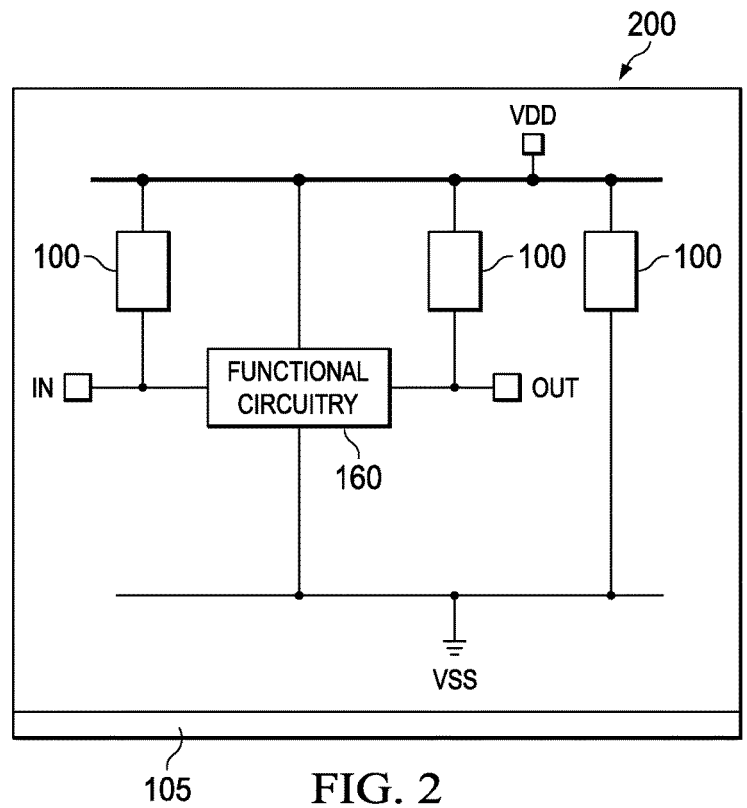
FIG. 2 shows an example ESD protected IC including functional circuitry on its semiconductor surface coupled by a VDD rail to a VDD bond pad and a VSS rail to a VSS bond pad and a plurality of inputs/outputs comprising at least one input coupled to an input bond pad (IN) and at least one output coupled to an output bond pad (OUT) for external connections to the functional circuitry, with an ESD protection circuit between VDD and VSS, and ESD protection circuits between IN and VDD and between OUT and VDD.

FIG. 2 shows an example ESD protected IC 200 including functional circuitry 160 on the semiconductor surface of its substrate 105 having a VDD rail coupled by a VDD pad for connecting to VDD and a VSS rail coupled to a VSS pad for connecting to VSS (e.g., ground), with ESD protection is provided by disclosed ESD protection circuits 100. Functional circuitry 160 has a plurality of inputs and outputs shown as an input terminal coupled to an input bond pad (IN) and output terminal coupled to an output bond pad (OUT), where IN and OUT both provide external connections to the functional circuitry 160. There are disclosed ESD protection circuits 100 shown between IN and VDD, between OUT and VDD and between VDD and VSS. Other configurations for disclosed ESD protected ICs can include placing an ESD protection circuit 100 between OUT and VSS and between IN and VSS.

The IN and OUT pads operate as common input and output terminals, respectively, by way of which functional circuitry 160 can receive incoming signals and can generate outputs, as well known in the art. Functional circuitry 160 realizes and carries out desired functionality of ESD protected IC 200, such as that of a digital IC (e.g., digital signal processor (DSP)) or analog IC (e.g., amplifier or power converter). The capability of functional circuitry provided by ESD protected IC 200 may vary, for example ranging from a simple device to a complex device. The specific functionality contained within functional circuitry 160 is not of importance to disclosed embodiments.

Figure 3:
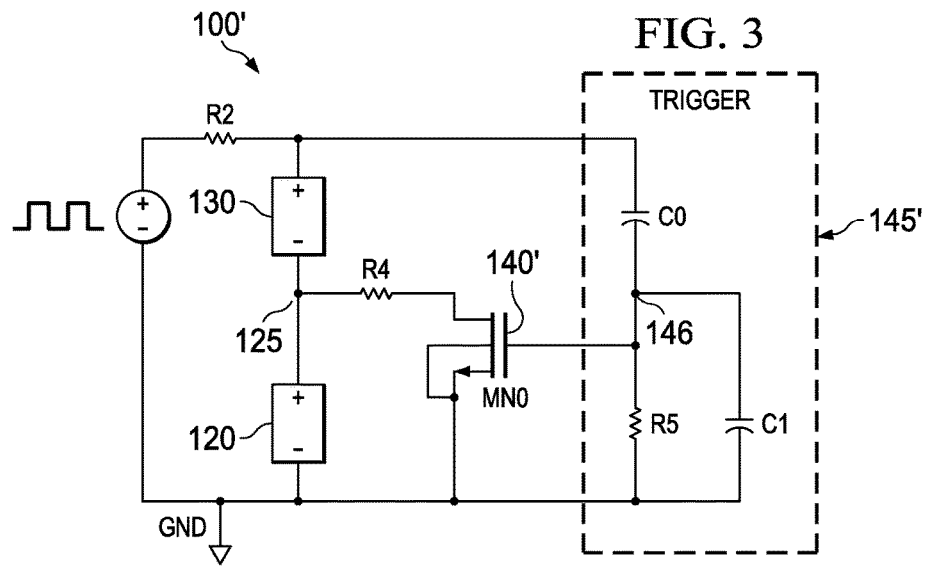
FIG. 3 shows an example circuit design for the ESD protection circuit shown in FIG. 1A, according to an example embodiment.

FIG. 3 shows an example circuit design for the ESD protection circuit shown in FIG. 1A labeled as ESD protection circuit 100', according to an example embodiment. The active shunt transistor is shown as MN0 140' which is an NMOS transistor having its drain coupled to the common intermediate node 125 between first ESD cell 120 and a second ESD cell 130 by a resistor shown as R4, such as between 1 ohm and 10 kohms (e.g., 100 ohms to 3 kohms). R4 is positioned to protect the MN0 140', for the case where the ESD cell it bypasses shown as first ESD cell 120 is conducting ESD current. R4 may not be needed at all for some/many variants of disclosed designs.

In this arrangement, the series combination of R4 and the drain to source path of MN0 140' is in parallel to first ESD cell 120. The trigger circuit is shown as trigger circuit 145' comprising an RC network including C0, R5 and C1, where the node 146 between C0 and R5 is common with the gate of MN0 140'. The ESD stimulus shown is provided by a pulsed DC power source that in one test arrangement provides 50 V square waves (V2=50 V, V1=0V) with a 1 μsec period that is coupled to the VDD rail of ESD protection circuit 100' by R2 shown, such as a 50 ohm resistor. The VSS rail is shown grounded.

Disclosed ESD protection circuits solve the problem of lack of an efficient and immune to latchup circuit for ESD protection of high voltage pins, and the inability to use one ESD cell architecture in various voltage ratings to avoid costly developments of new ESD Devices. As described above, active trigger voltage modulation can be provided to reduce the trigger voltage inherent in stacked ESD Cells. Further, this technique can be used to tune the trigger voltage of the stack and may be logically disabled under desired operating conditions.

EXAMPLES

Disclosed embodiments are further illustrated by the following specific Examples, which should not be construed as limiting the scope or content of this Disclosure in any way.

Figure 4:
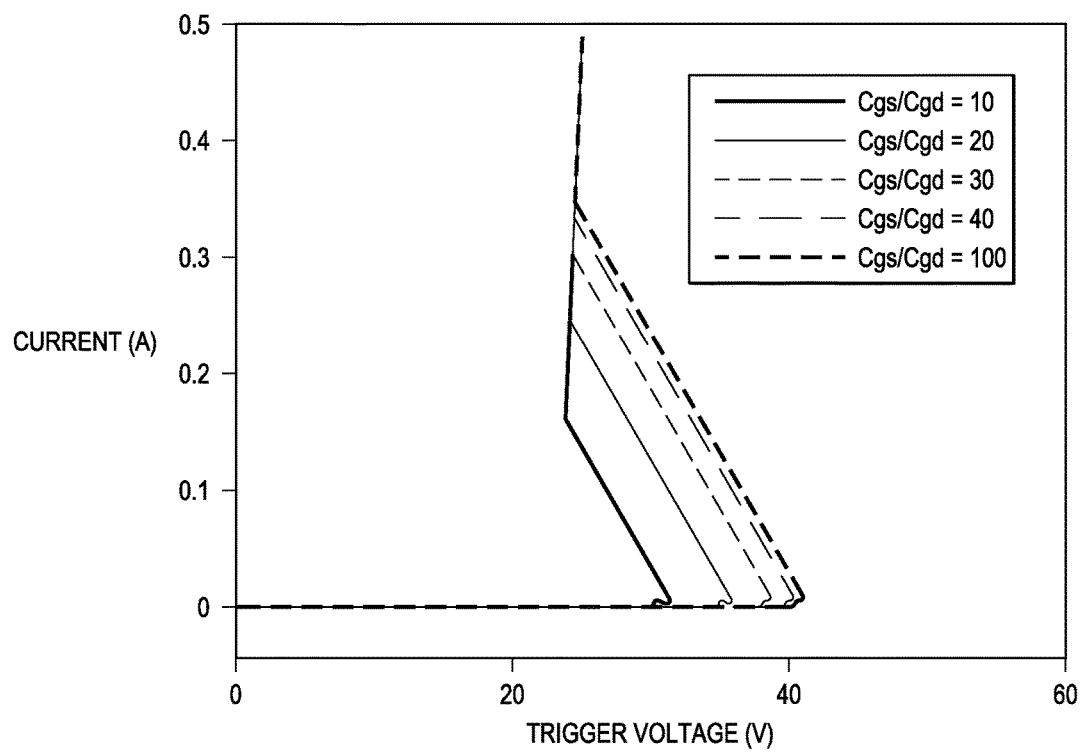
FIG. 4 depicts current vs. trigger voltage data evidencing modulation of the trigger voltage provided by a disclosed ESD protection circuit obtained by changing the circuit design of the active shunt, where the ratio of the capacitance from gate-source and gate-drain of an active shunt transistor comprising NMOS transistor changes the gate voltage applied to the NMOS transistor which is seen to change the trigger voltage of the ESD protection circuit.

FIG. 4 depicts current vs trigger voltage data evidencing modulation of the trigger voltage provided by a disclosed ESD protection circuit 100' obtained by changing the circuit design of the active shunt. The ratio of the capacitance from gate-source and gate-drain of an active shunt comprising NMOS transistor changes the gate voltage applied to the NMOS transistor which changes the trigger voltage as shown for the ESD protection circuit.

Disclosed embodiments can be used to form semiconductor IC die that may be integrated into a variety of assembly flows to form a variety of different devices and related products. Disclosed ESD protection circuits are particularly well suited for protecting circuits that handle high voltage applications (e.g., >20V). The semiconductor die may include various elements therein and/or layers thereon, including barrier layers, dielectric layers, device structures, active elements and passive elements including source regions, drain regions, bit lines, bases, emitters, collectors, conductive lines, conductive vias, etc. Moreover, the semiconductor die can be formed from a variety of processes including bipolar, Insulated Gate Bipolar Transistor (IGBT), CMOS, BiCMOS and MEMS.

Those skilled in the art to which this disclosure relates will appreciate that many other embodiments and variations of embodiments are possible within the scope of the claimed invention, and further additions, deletions, substitutions and modifications may be made to the described embodiments without departing from the scope of this disclosure.

The invention claimed is:

1. An electrostatic discharge (ESD) protection circuit, comprising:
a substrate having a semiconductor surface that said ESD protection circuit formed thereon;
a first ESD cell connected to and between a first node and a second node;
a second ESD cell connected to and between the second node and a third node;
a third ESD cell connected to and between the third node and a fourth node;
an active shunt connected to and between the first node and the third node so as to be electrically in parallel with a combination of the first ESD cell and the second ESD cell, said active shunt including an active shunt transistor having a control node; and
a trigger circuit connected to the first node and the fourth node and having a trigger output coupled to the control node.

2. The ESD protection circuit of claim 1, wherein the first ESD cell, the second ESD cell, and the third ESD cell each comprise a semiconductor-controlled rectifier (SCR).

3. The ESD protection circuit of claim 1, wherein the active shunt transistor comprises a metal-oxide-semiconductor (MOS) transistor and said control node comprises a gate electrode of the MOS transistor.

4. The ESD protection circuit of claim 1, wherein the active shunt transistor comprises a bipolar junction transistor (BJT) and the control node comprises a base of the BJT.

5. The ESD protection circuit of claim 1, wherein the first node is a high power supply rail (VDD rail) and the fourth node is a low power supply rail (VSS rail) on said semiconductor surface.

6. The ESD protection circuit of claim 5, wherein the active shunt comprises a metal-oxide-semiconductor (MOS) transistor and the control node comprises a gate electrode of the MOS transistor, and wherein a source of the MOS transistor is coupled to the third node by a resistor having a resistance between 1 ohm and 10 kohms.

7. The ESD protection circuit of claim 1, wherein the substrate comprises silicon.

8. The ESD protection circuit of claim 1, further comprising functional circuitry on the semiconductor surface coupled by a high power supply rail (VDD rail) to a VDD pad and a low power supply rail (VSS rail) to a VSS pad, and a plurality of input/output terminals comprising at least one input coupled to an input bond pad (IN) and at least one output coupled to an output bond pad (OUT) for external connections to the functional circuitry,
wherein a first of said ESD protection circuit is coupled between the VDD pad and the VSS pad and a second of said ESD protection circuit is coupled between the IN and the VDD pad or the VSS pad and a third of said ESD protection circuit is between the OUT and the VDD pad or the VSS pad.

9. An ESD protected integrated circuit (IC), comprising:
a substrate having a semiconductor surface;
a high power supply rail (VDD rail) coupled to a VDD pad and a low power supply rail (VSS rail) coupled to a VSS pad on the semiconductor surface;
functional circuitry on the semiconductor surface having supply terminals coupled to the VDD rail and to the VSS rail, and a plurality of input/output terminals comprising at least one input coupled to an input bond pad (IN) and at least one output coupled to an output bond pad (OUT) for external connections to the functional circuitry;
wherein a first ESD protection circuit is coupled between the VDD pad and the VSS pad, a second ESD protection circuit is coupled between the IN and the VDD pad or the VSS pad, and a third ESD protection circuit is between the OUT and the VDD pad or the VSS pad;
a first ESD cell stacked in series with a second ESD cell and a third ESD cell, wherein the first ESD cell is connected to and between the VDD rail and a first intermediate node, the second ESD cell is connected between the first intermediate node and a second intermediate node, and the third ESD cell is connected to and between the second intermediate node and the VSS rail;
an active shunt connected to and between the first intermediate node and the VSS rail so as to be electrically in parallel with the second ESD cell and the third ESD cell, said active shunt including an active shunt transistor with a control node; and
a trigger circuit connected to and between the VDD rail and the VSS rail, the trigger circuit having a trigger input and a trigger output, wherein the trigger output is coupled to the control node.

10. The ESD protected IC of claim 9, wherein the first ESD cell, the second ESD cell, and the third ESD cell each comprise a snap-back cell.

11. The ESD protected IC of claim 10, wherein the snap-back cell comprises an SCR, JFET, gate ground MOS transistor, or a Zener diode.

12. The ESD protected IC of claim 9, wherein the active shunt transistor comprises a MOS field effect transistor that comprises a metal-oxide-semiconductor (MOS) transistor and the control node comprises a gate electrode of the MOS transistor.

13. The ESD protected IC of claim 9, wherein the active shunt transistor comprises a bipolar junction transistor (BJT) and the control node comprises a base of the BJT.

14. The ESD protected IC of claim 9, wherein the active shunt transistor comprises a metal-oxide-semiconductor (MOS) transistor and the control node comprises a gate electrode of said MOS transistor, and wherein a drain of the MOS transistor is coupled to the second intermediate node by a resistor having a resistance between 1 ohm and 10 kohms.

15. The ESD protected IC of claim 9, wherein the substrate comprises silicon.

* * * * *